United States Patent [19]

Apilat et al.

[11] Patent Number: 4,485,072

[45] Date of Patent: Nov. 27, 1984

[54] APPARATUS AND METHOD OF GROWING AND DISCHARGING SINGLE CRYSTALS

[76] Inventors: Vitaly Y. Apilat, ulitsa 23 Avgusta, 55b, kv. 36; Valentin I. Goriletsky, ulitsa 23 Avgusta, 40, kv. 11; Vladimir G. Maximov, ulitsa Derevyanko, 6, kv. 48; Oleg S. Mjulendorf, ulitsa Geroev Truda, 47-b, kv. 242; Alexei V. Radkevich, prospekt Pravdy, 5, kv. 128; Leonid D. Chernitsky, ulitsa Roberta Eidemana, 15, kv. 56; Lev G. Eidelman, prospekt Lenina, 31-b, kv. 70, all of Kharkov, U.S.S.R.; Viktor Y. Vakulenko, deceased, late of Kharkov; by Raisa P. Vakulenko, administrator, ulitsa Komandarma Uborevicha, 44, kv. 8, Khardov, both of U.S.S.R.

[21] Appl. No.: 351,973

[22] Filed: Feb. 24, 1982

[51] Int. Cl.[3] .................... C30B 15/10; C30B 15/32

[52] U.S. Cl. .................... 422/249; 156/DIG. 98

[58] Field of Search .................. 422/249; 156/617 SP, 156/618, DIG. 98, DIG. 83, DIG. 73; 269/17, 287, 46, 76

[56] References Cited

U.S. PATENT DOCUMENTS

| | | | |
|---|---|---|---|
| 3,865,554 | 2/1975 | Wenckus et al. | 422/249 |
| 4,190,630 | 2/1980 | Apilat | 422/249 |
| 4,350,560 | 9/1982 | Helgeland et al. | 422/249 |

FOREIGN PATENT DOCUMENTS

| | | | |
|---|---|---|---|
| 0011883 | 1/1979 | Japan | 156/DIG. 98 |

*Primary Examiner*—Hiram H. Bernstein
*Attorney, Agent, or Firm*—Murray Schaffer

[57] ABSTRACT

Single crystals are grown from a melt in a frame-mounted furnace housing consisting of a stationary top furnace member and a movable base furnace member adapted to be butt-joined to the top one, and a vertically reciprocatable crystal-pull rod with a seed crystal holder extending into the top furnace member. A crucible with a heater is arranged in the base member. The base member is movable from beneath the top furnace member to permit the pull rod and the grown crystal to be lowered for removal of the crystal without lateral movement of the pull rod and/or crystal frame. A heat insulated discharge vessel is provided for receiving and transporting the removed crystal.

4 Claims, 5 Drawing Figures

APPARATUS AND METHOD OF GROWING AND DISCHARGING SINGLE CRYSTALS

BACKGROUND OF THE INVENTION

1. Field of the Invention

The present invention relates to apparatus for growing single crystals by pulling them from a melt frozen on a seed crystal as well as to a method of withdrawing the grown crystals from each apparatus.

This invention proves most advantageous in growing large single crystals, for example crystals of above 200 mm in diameter, over 300 mm in length, and weighing tens of kilograms and more. In particular, the invention can be used in growing large optical and scintillation crystals of haloid fluorine compounds (sodium chloride, potassium chloride, potassium bromide, sodium bromide, lithium fluoride, cesium iodide, sodium iodide activated by tallium, cesium iodide activated by thallium or sodium) as well as semiconductor single crystals (germanium, silicon and others).

2. Description of the Prior Art

One of the most widely used methods of producing single crystals is by pulling them from a melt frozen on a seed crystal, which is usually monocrystalline. The method is based on the techniques of Czochralski and Kyropoulos (see J. Czochralski, Eine neues Verfahren zur Messung der Kristallisationgeschwindigkeit der Metalle.—Z. Phys. Chem., 1918, 92, 219–224 and also S. Kyropoulos, Ein Verfahren zur Herstellung großer Kristalle.—Z. anorg. u. allgem. Chem., 1926, 154, 308–313).

According to the above technique, starting materials are heated in a crucible to produce a melt and then a monocrystalline seed held on a rotating vertical rod is lowered to touch the melt. After a small portion of the seed has been molten it is slowly raised and the temperature of the melt is lowered so that the melt begins to freeze onto the seed. As the crystal grows the temperature of the melt is controlled so as to prevent further growth when the crystal has acquired predetermined dimensions. When the growing crystal is of a predetermined length it is rapidly pulled away from the melt by lifting the pulling rod. The grown crystal is then cooled to be used for its designated purpose.

The grown crystal may actually be cooled to room temperature above the crucible holding the solidified portion of the remaining melt, i.e. it can be done directly in the furnace growing chamber. However, since the temperature distribution throughout the furnace chamber is uneven and with the end of rapid withdrawal of the grown crystal, to make the chamber available for the next growing cycle, cooling is usually carried out in a separate furnace (an annealing furnace) wherein the crystal temperature is equalized througout its volume and subsequently lowered to the room temperature.

As the grown crystal is transferred from the growing chamber to the annealing chamber it may develop cracks and/or break away from the seed as a result of the severe thermal conditions due to high temperature gradients (thermal shock). Thermal shock is an important problem which is especially felt in growing large crystals.

Known in the art is an apparatus for growing single crystals using the Kyropoulos technique, which apparatus comprises a heated crucible to hold the melt and to provide a working volume, a lid for closing the crucible composed of two semicircular members, a pulling rod provided with a seed holder vertically extending to the crucible through the lid, and a drive for moving the pulling rod in both rotational and translational modes (see K.—T. Wilke, Vyrashchivanie Kristallov, Leningrad, Nedra Publishers, 1977, p. 330–331, FIGS. 3.2–5). The grown single crystal is withdrawn from the above apparatus as follows. In the beginning the crystal is pulled away from the melt and the lid is opened by separating its semicircular members and the pulling rod with the crystal is rapidly lifted above the lid. Following this is a horizontal transfer of the pulling rod away from the crucible whereupon the rod is lowered (e.g. into an annealing furnace) and the crystal is let loose of the seed holder.

It is however to be understood that in the process of opening the lid, withdrawing the crystal from the crucible and transferring the crystal to the annealing furnace both the seed and the crystal grown are sensitive to the action of cold air whereby thermal shock is produced that may be the cause of cracks and the crystal breakdown, as has already been stated above.

Also, starts and stops during the horizontal transfer of the crystal suspended from the seed may result in breakdown of the crystal due to inertia, especially a crystal having large dimensions and weight.

Moreover, it is to be appreciated that withdrawing the crystal through the lid requires an apparatus having the height commensurable with the length of the crystal grown. This is a particular problem in growing long crystals.

An improvement over the above apparatus is an apparatus for growing single crystals from a melt, comprising a frame-mounted and pressure-tight furnace housing horizontally split into two members, a crystal-pulling rod provided with a seed-crystal holder and vertically extending from external of the furnace housing into the top furnace member, a drive means for moving the crystal-pulling rod in both rotational and translational modes, and a crucible with a heater arranged in the furnace base member (see U.S. Pat. No. 3,865,554). The furnace base member is immovable on the frame while the top furnace member is swingable away together with the crystal-pulling rod and the seed-crystal holder.

The crystal grown is withdrawn from the furnace housing as follows. Following the step of pulling the crystal away from the melt the pressure in the growing chamber is equalized with atmosphere by letting the air in, if the crystal was grown in a vacuum, or by releasing the gas from the chamber, if the crystal was grown under an excessive pressure. Then the top furnace member is detached from the furnace base member and, together with the pulling rod and the seed crystal with the crystal grown suspended therefrom, is raised so that the lower end face of the top furnace member is above the upper end face of the crucible. Then the top furnace member together with the pulling rod and the crystal is transferred horizontally away from the furnace base member and the crystal is separated from the pulling rod after the latter was advanced from the top furnace member.

At first glance in the above apparatus the seed crystal and the crystal grown seem to be isolated from the outside cold air at least as long as they are inside the top furnace member since both the seed crystal and the crystal grown are in the heated air (or the gas wherein the crystal was grown) that fills the top furnace member.

However, the jointing plane of the furnace housing in the prior art apparatus is below the upper end face of the crucible, therefore when the top furnace member is raised, the outside cold air flows into the same member in amounts equal to the total volume of the crucible portion, of the heater and other of the structural members associated with the latter inside the furnace base member above the jointing plane which were inside the top furnace member prior to the raising thereof. Also as the top furnace member is horizontally transferred together with the crystal-pulling rod carrying the seed holder and the crystal grown, the outside cold air can flow also into the top furnace member due to turbulence produced by the transfer movement. Thus, the above described apparatus does not completely exclude contact of the seed crystal and the grown crystal from cold air, i.e. the thermal shock is possible.

And finally it is to be noted that in both the apparatus described above the single crystal suspended from the seed crystal may break away due to inertia as they are horizontally moved.

SUMMARY OF THE INVENTION

The major object of the invention is to provide an apparatus for growing single crystals from a melt wherein the grown crystal is not subjected to thermal shocks and horizontal forces of inertia, as it is withdrawn from the apparatus, whereby cracks in the crystal and breakaway are eliminated.

A further object of the invention is to provide apparatus for growing single crystals from a melt insuring an increase in the yield of single crystals without decreasing the output rate.

Another object of the invention is to provide a straight-forward method of withdrawing a single crystal from the apparatus of the invention.

Among other objects of the invention is the provision of a simple to produce and expedient apparatus for growing single crystals from a melt which is reliable in operation.

The above and other objects of the invention are attained by providing an apparatus for growing single crystals from a melt, comprising a frame-mounted furnace housing horizontally split into two members—a top furnace member and a furnace base member, a crystal-pulling rod provided with a seed-crystal holder and vertically extending from external of the furnace housing into the top furnace member, drive means for moving the crystal-pulling rod in both rotational and translational modes, and a crucible with a heater arranged in the furnace base member and under the crystal-pulling rod, wherein according to the invention the furnace base member is arranged for movement vertically and in a horizontal plane with respect to the frame, the top furnace member is attached to the latter immovably, and the jointing plane of the furnace housing is substantially level with the upper end face of the crucible.

With such arrangement the crystal grown is withdrawn from the furnace housing without horizontal movement that gives rise to the forces of inertia which are responsible for the breakage of the seed crystal and the crystal grown. The furnace housing is opened by moving the furnace base member downwardly and side-ways from the top furnace member while the latter member and the crystal-pulling rod with a crystal suspended therefrom remain stationary. The crystal then may be withdrawn from the top furnace member to be transferred by translating the crystal-pulling rod downwardly, into another receptacle, e.g. a movable annealing furnace, which may be placed under the top furnace member.

Moreover, the grown crystal is not exposed to thermal shocks since on the one hand the crystal is in the hot air atmosphere and on the other hand the jointing plane of the furnace housing is level with the upper end face of the crucible (or of the upper end of the heater or the other members associated with the crucible) that is why cold air cannot enter the top furnace member and, consequently, affect the grown crystal as the furnace base member is lowered and displaced laterally. Due to the fact that all the structural components in the novel apparatus are arranged in the furnace base member (the crucible, the heater and others) so that none extends beyond the upper end thereof, the furnace base member has a minimum travel or stroke vertically and a minimum clearance is required between the lowered furnace base member and the stationary top furnace member, which is sufficient to displace the furnace base member laterally. Thereby the time required to open the furnace housing before the furnace base member can be displaced may be minimized to essentially decrease the possibility of negative external action on the grown crystal, leading to its breakaway.

It is preferable that the apparatus be provided with a heat-insulated balancing vessel arranged adjacent the furnace housing, movable to take the place of the furnace base member under the top furnace member, and having a height substantially level with the jointing plane of the furnace housing.

This embodiment further reduces the possibility of thermal shocks, sinse the step of withdrawing, i.e. advancement of the crystal from the top furnace member is in a downward direction, which follows the step of opening the furnace housing, will also be carried out without the action of the outside cold air on the crystal because this action will be hindered by the walls of the heat-insulated balancing vessel, this being especially the case when the vessel has a tight connection with the top furnace member. Such a seal can be easily provided inasmuch as the balancing vessel is, according to the invention, substantially as high as the level of the jointing plane of the furnace housing.

If the apparatus of the invention is provided with the above balancing vessel, it is desirable that the lower end of the pulling rod be screw threaded and the seed-crystal holder be made in the form of a coupling nut having a screw threaded hole for connection to the pulling rod and an adjacent hole for receiving the seed crystal, the latter hole having the form excluding turning over of the nut about the seed crystal, and in the position when the balancing vessel is placed under the top furnace member and the grown crystal abuts against the bottom of the vessel, the upper end face of the nut be not higher than the jointing plane between the vessel and the top furnace member.

As can be seen from the description that follows, such arrangement provides a convenient way of separating the grown crystal from the crystal pulling rod which is especially important when the top furnace member is tightly connected to the balancing vessel and there is no access to the seed crystal and the holder thereof. With the above described position of the nut with respect to the jointing plane of the furnace housing the balancing vessel can freely move together with the separated crystal in a horizontal plane to subsequently cool the crystal in this vessel or to load it into an annealing furnace.

The above objects of the present invention along with other objects which will become apparent as the description proceeds are attained by providing a method of withdrawing a single crystal from the apparatus of the invention comprising the above described balancing vessel and the coupling nut. The method consists in the following. After the crystal has grown to predetermined dimensions it is raised to the top furnace member, the furnance base member is vertically lowered and taken away from the top furnace member. Then the balancing vessel is place under the crystal instead of the furnace base member. The next step consists in lowering of the pull rod with the crystal and simultaneous rotation of the rod in the direction of unscrewing the nut, whereby the nut and the crystal are released from the crystal-pulling rod when the crystal comes in frictional arrangement with the bottom of the balancing vessel.

Such method of withdrawing a single crystal apart from eliminating cracking and breakdown of the crystal makes it possible to separate the latter from the crystal-pulling rod without additional tools and in a very short time which makes the apparatus of the invention easier to operate and more productive.

BRIEF DESCRIPTION OF THE DRAWINGS

The invention will become more apparent from the following description of a specific example of carrying it into effect with reference to the accompanying drawings, in which.

DETAILED DESCRIPTION OF THE INVENTION

Figure 1:
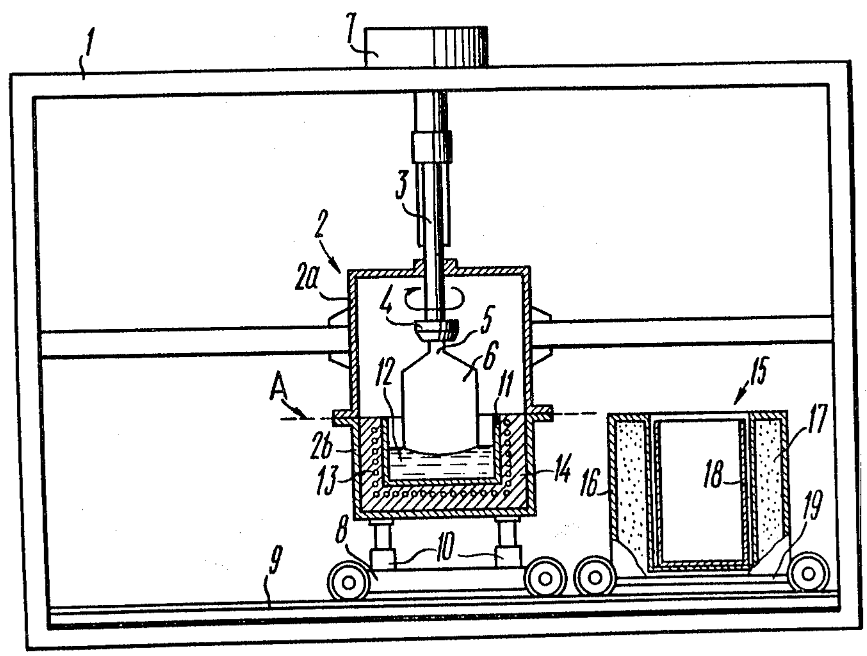
FIG. 1 is a diagrammatical sectional view of an apparatus for growing single crystals from a melt, showing a growing phase.

Referring to FIG. 1, an apparatus for growing single crystals from the melt comprises a frame 1 carrying a furnace housing 2, a vertical crystal-pulling rod 3 provided with a holder 4 for a seed crystal 5 wherein a single crystal 6 is grown, as well as a drive means 7 for moving the crystal-pulling rod 3 in both rotational and transitional modes. The furnace housing 2 is horizontally split into two members—a top furnace member 2*a* and a furnace base member 2*b*, the jointing plane being shown in a dotted line and designated by arrow A in FIG. 1. With the present embodiment the top furnace member 2*a* is attached to the frame 1 immovably and the furnace base member 2*b* is arranged for movement vertically and in a horizontal plane with respect to the frame 1. To effect motion of the furnace base member 2*b*, there is provided a carriage 8 mounted on rails 9 laid on the frame 1 and carrying a mechanism 10 for raising and lowering the furnace base member 2*b*. The mechanism 10 may be of a mechanical or hydraulic type.

The apparatus also comprises a crucible 11 for holding a melt 12. The crucible is provided with a heater 13 and has a refractory lining 14. The crucible 11 is installed in the furnace base member 2*b* and the jointing plane A of the furnace housing 2 is level with the upper end face of the crucible 11 or the heater 13, the lining 14 or of any other member associated with the crucible 11 depending on the elevation of the highest member.

The rod 3 extends from the extension of the furnace housing 2 into the top furnace member 2*a* and is connected to the drive means providing for movement of the rod 3 with respect to the crucible 11.

Figure 2:
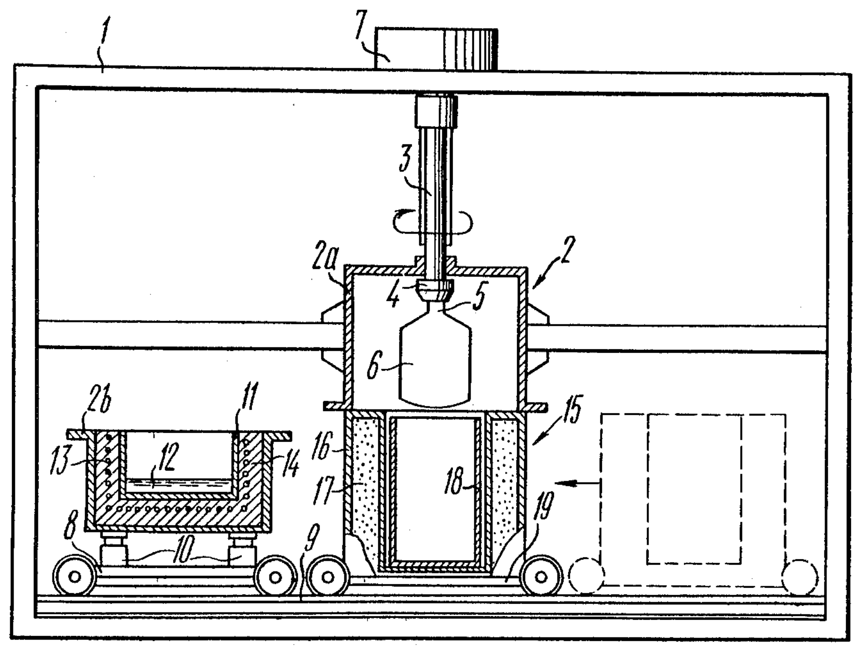
FIG. 2 is a view similar to that shown in FIG. 1 but showing a withdrawing phase when the balancing vessel is under the top furnace member instead of the furnace base member and the crystal is raised to the top furnace member, an initial position of the balancing vessel being shown in dotted lines.

The apparatus also comprises a heat-insulated balancing vessel 15 including a shell 16 with a heat-insulation liner 17 and a removable cylinder 18 made of a heat-resistant material. The balancing vessel 15 is movable in a horizontal plane on a carriage 19 rolling along the rails 9. The balancing vessel 15 has a height such as to make it possible to place the vessel under the top furnace member 2*a* with a minimum clearance therewith or substantially clearance free as shown in FIG. 2.

Figure 3:
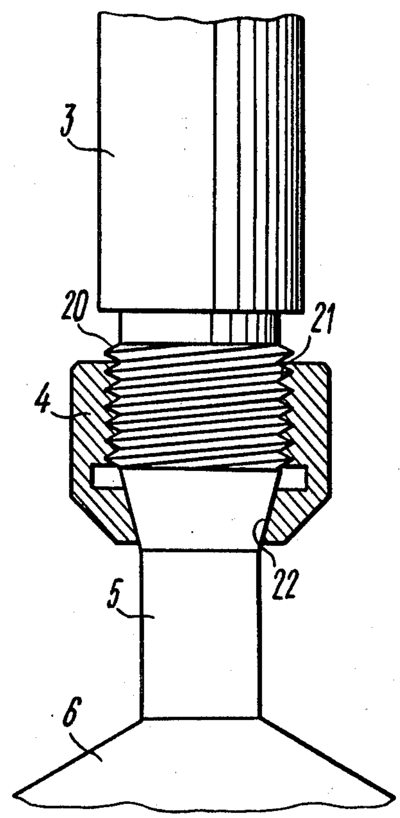
FIG. 3 is an enlarged view of the crystal-rod junction.

Now referring to FIG. 3, the lower end of the rod 3 is provided with screw thread 20 and the holder 4 for the seed crystal 5 is a coupling nut having a thread hole 21 for establishing connection with the rod 3 and an adjacent hole 22 for receiving the seed crystal 5. The hole 22 has a form which excludes rotation of the nut 4 about the seed crystal 5. Such a form is well known to a person skilled in this art. Turning again to FIG. 3, an exemplary hole 22 has a form of a reversed truncated pyramid, the seed crystal 5 has a similar form on a corresponding portion thereof. When the balancing vessel 15 is placed under the top furnace member 2*a* and the crystal 6 abuts against the bottom portion of the vessel 15 or more precisely against the bottom of the cylinder 18 (FIGS. 2 and 4) the upper end face of the nut 4 is not above the jointing plane between the vessel 15 and the top furnace member 2*a*.

The above described apparatus operates as follows. Initially the furnace base member 26 (FIG. 2) is lowered and displaced laterally. A starting material, e.g. potassium chloride in a powder form, is charged into the crucible 11. The nut 4 with a monocrystalline seed 5 of the same composition as the one of the starting material and having, e.g. a square cross section, is screwed onto the rod 3 until the upper end face of the seed crystal 5 abuts against the lower end face of the rod 3 (FIG. 3). Then the furnace base member 26 is moved on the carriage 8 to be axially aligned with the top furnace member 2*a* whereafter the mechanism 10 brings the furnace base member 2*b* in contact with the top furnace member 2*a* (FIG. 1). If desired (a controlled atmosphere in the furance housing is required) the furnace housing 2 is made air-tight by conventional means. The starting material is melted by the heater 13 in the crucible 11. The drive means 7 rotates the rod 3 and simultaneously translates the same rod 3 together with the seed crystal 5 downwardly until the latter touches the melt 12. After the seed crystal 5 has been partially melted the drive means 7 slowly raises the rod 3 with the holder 4 and the seed crystal 5, and the crystal 6 grown thereon. After the crystal 6 has been grown to a predetermined length it is pulled away from the melt by rapidly raising the rod 3 until the lower end of the crystal 6 is above the jointing plane A of the furnace housing 2. If the crystal was grown in a controlled atmosphere, the pressure in the furnace housing is equalized with the atmosphere.

The mechanism 10 thereafter lowers the furnace base member *2b* and the carriage 8 carries it away. Now the crystal 6 can be withdrawn from the top furnace member *2a*.

With the embodiment of the invention when the present apparatus comprises the balance vessel 15 and the coupling nut 4 the grown crystal 6 is withdrawn from the top furnace member *2a* in the following way.

Figure 4:
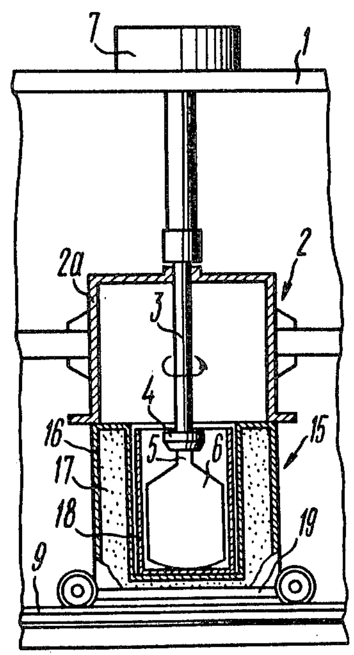
FIG. 4 is a partial view of the apparatus of FIG. 2 in a position when the crystal is lowered into the balancing vessel.
Figure 5:
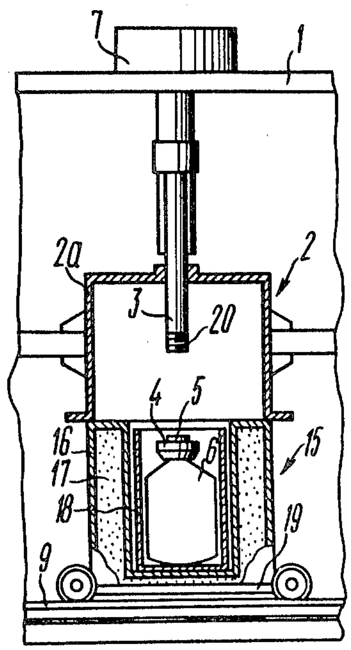
FIG. 5 is a view similar to that shown in FIG. 4 but illustrating a position with the crystal separated from the pulling rod.

In place of the removed furance base member *2b* the balancing vessel 15 is moved in the direction of arrow in FIG. 2. The cylinder 18 preheated to a desired temperature in an individual furnace. E.g. an annealing furnace. The clearance between the adjacent end faces of the top member *2a* and the vessel 15 is bridged, as with a piece of an air-tight flame-proof fabric, to preclude outside air from entering the working volume of the housing 2. Now the drive means 7 rotates the rod 3 in the direction of unscrewing the nut 4 and translates it downwardly until the crystal 6 abuts against the bottom of the cylinder 18 (FIG. 4). Since the hole 22 in the nut 4 has the form which prevents turning over of the nut 4 about the seed crystal 5 (FIG. 3) the frictional engagement of the crystal with the bottom of the cylinder 18 of the balancing vessel 15 (FIG. 4) will cause the nut 4 to screw off the rod 3 whereby the crystal 6 together with the nut 4 is separated or is freed of the rod 3 as can be seen in FIG. 5. The rod 3 is then raised to return into the top furnace member *2a* (FIG. 5), and the balancing vessel 15 is moved away from under the top member *2a*. Then the cylinder 18 with the crystal 6 is removed from the vessel 15 into be charged to an annealing furnace (not shown) to equalize the temperature throughout the crystal and for slowly cooling it to room temperature. If desired, the cylinder 18 may be equipped with a removable lid (not shown) to close the same prior to taking the vessel 15 away from the top furnace member *2a*. Such a lid can be brought to the cylinder 18 through the clearance between the top furnace member *2a* and the balancing vessel 15.

After the crystal has been withdrawn the crucible 11 is charged with another portion of the starting material, another seed crystal 5 is fixed on the rod 3, the furnace base member *2b* is aligned with the top furnace member *2a* and brought in contact there with and then the next cycle of growing the crystal is carried out as described above.

It is also to be noted that if the rod 3 and the nut 4 have a right-hand thread, then the rod 3 should be rotated in the direction shown in FIG. 1 during the crystal growing, and during the phase of withdrawing it should be rotated in the reverse direction as in FIG. 4; but if the thread is left-handed, then the directions should be respectively reversed. If rotation of the rod 3 during the stage of crystal growing is not required, it is rotated during the stage of withdrawing as described above.

It is to be appreciated that in the apparatus of the invention the grown crystal 6 is not subjected to thermal shocks during any stage in the withdrawal of the crystal from the furnace housing 2.

As the furnace base member *2b* is lowered, outside cold air will not enter the top furnace member *2a*, since the jointing plane A (FIG. 1) is level with the end face of the crucible 11 and there are not structural parts associated with the furnace base member *2b*, which are present within the top furnace member *2a*.

After the furnace base member has been taken away laterally, outside cold air will not reach the crystal 6, since the lower end of the top furnace member *2a* is below the crystal.

As soon as the balancing vessel 15 is attached to the top furnace member *2a* (FIG. 2) there is provided an enclosed space wherein the crystal 6 is protected from the action of outside cold air. Therefore when the crystal 6 is transferred into the balancing vessel 15, no thermal shock occurs.

And finally, the crystal 6 is protected with the walls and the lid of the cylinder 18 as it is transferred from the balancing vessel 15 to the annealing furnace, which excludes thermal shocks as well.

Thus, thermal shock is eliminated during all phases of the crystal transfer operation from the furnace housing to the annealing furnace.

Also, inasmuch as the crystal is withdrawn only in a vertical direction the horizontal forces of inertia are eliminated.

As follows from the above description the apparatus of the invention provides for a considerable increase in the yield of single crystals without a decrease in the output rate since the furnace housing 2 is rapidly emptied and ready for the next growing cycle while the withdrawing of crystals is carried out in a short time and under favourable thermal conditions.

While only one specific example of carrying out the invention has been described it is obvious to those skilled in the art that various modifications in the apparatus described are possible and the invention is not limited in that. Thus, for example, handling of the crystals in the present apparatus may be carried out in a circular path or the frame may have swingable rails to drive the balancing vessel and the furnace base member beyond the frame, which renders the apparatus more compact. Such modifications are deemed to be within the scope of the invention as defined by the appended claims.

What is claimed is:

1. Apparatus for growing single crystals from a melt comprising:

a frame, a furnace chamber comprising a top furnace member and a base furnace member separable along a horizontal jointing plane, a crucible for said melt arranged in said base furnace member, the upper edge of said crucible being substantially level with the horizontal jointing plane, heating means surrounding said crucible, a crystal pull rod extending along a vertical axis through said furnace, said rod being reciprocatable along said axis from an upper position in said top furnace frame to a lower position extending therethrough into said base furnace member, drive means for reciprocating said rod and for simultaneously rotating said rod about its axis, a seed-crystal holder mounted on the lower end of said pull-rod for the growth of a single crystal thereon from said melt, said top furnace member being stationarily fixed to said frame and said base furnace member being movable between a first position in vertical alignment with said top furnace member and a second position offset from alignment with said top furnace member, whereby, in said first position said pull rod may be manipulated to grow said crystal, and in said second position said pull rod may be manipulated to remove said crystal, while said pull rod, crystal holder and crystal are maintained in the same vertical axis.

2. The apparatus according to claim 1 wherein said base furnace member is mounted on a carriage provided with means for raising and lowering said base furnace member, said base furnace member being elevatable, in said first position into sealing contact with said top furnace member, and thereafter lowerable for movement into said second position.

3. The apparatus according to claim 2 including a heat insulated discharge vessel having a height substantially level with said jointing plane, movable into a position beneath said top furnace member on movement of said base furnace member into said second position, said discharge vessel being adapted to receive and transport said crystal grown on said pull rod, to a remote position.

4. The apparatus according to claim 3 wherein the lower end of said pull rod is threaded and said seed-crystal holder comprises a threaded coupling nut connectable thereto, said nut having a central hole for receiving said seed crystal, said hole having a form preventing rotation of said nut relative to said seed crystal, said pull rod and nut being arranged so that when said crystal is grown and placed in said discharge vessel in abutment with the bottom thereof, the upper end face of the nut is not higher than the horizontal jointing plane.

* * * * *